(12) United States Patent
Spencer et al.

(10) Patent No.: US 9,303,505 B2
(45) Date of Patent: Apr. 5, 2016

(54) MULTI-PARAMETER BIT RESPONSE MODEL

(71) Applicants: Reed W. Spencer, Spring, TX (US); Jonathan M. Hanson, Salt Lake City, UT (US)

(72) Inventors: Reed W. Spencer, Spring, TX (US); Jonathan M. Hanson, Salt Lake City, UT (US)

(73) Assignee: BAKER HUGHES INCORPORATED, Houston, TX (US)

( * ) Notice: Subject to any disclaimer, the term of this patent is extended or adjusted under 35 U.S.C. 154(b) by 444 days.

(21) Appl. No.: 13/671,672

(22) Filed: Nov. 8, 2012

(65) Prior Publication Data

US 2013/0151219 A1  Jun. 13, 2013

Related U.S. Application Data

(60) Provisional application No. 61/568,891, filed on Dec. 9, 2011.

(51) Int. Cl.
| | | |
|---|---|---|
| *G06G 7/48* | (2006.01) | |
| *E21B 47/00* | (2012.01) | |
| *G06F 17/50* | (2006.01) | |
| *E21B 41/00* | (2006.01) | |

(52) U.S. Cl.
CPC .............. *E21B 47/00* (2013.01); *E21B 41/00* (2013.01); *G06F 17/5009* (2013.01)

(58) Field of Classification Search
None
See application file for complete search history.

(56) References Cited

U.S. PATENT DOCUMENTS

| | | | |
|---|---|---|---|
| 7,020,597 B2* | 3/2006 | Oliver et al. | 703/7 |
| 7,693,695 B2* | 4/2010 | Huang et al. | 703/7 |
| 7,899,658 B2* | 3/2011 | Oliver et al. | 703/10 |
| 8,296,114 B2* | 10/2012 | Prasad et al. | 703/10 |
| 2008/0255817 A1* | 10/2008 | Pabon et al. | 703/10 |

OTHER PUBLICATIONS

Uboldi, V., et al.; "Rock Strength Measurements of Cuttings as Input Data for Optimizing Drill Bit Selection"; Society of Petroleum Engineers 56441; p. 1-9; Oct. 3-6, 1999.

* cited by examiner

*Primary Examiner* — Omar Fernandez Rivas
*Assistant Examiner* — Nithya J Moll
(74) *Attorney, Agent, or Firm* — Cantor Colburn LLP

(57) ABSTRACT

A method of generating a directional response of a drill bit based on one or more drilling parameters includes performing actual or simulated tests with a drill bit in a test material having a strength under different experimental drilling parameters and recording the results of the plurality of tests. A representation of an expected directional response of the drill bit is formed based on the results. Current drilling parameters are receiving current drilling parameters at a computing device and the directional response is generated based on the current drilling parameters by utilizing the representation.

2 Claims, 3 Drawing Sheets

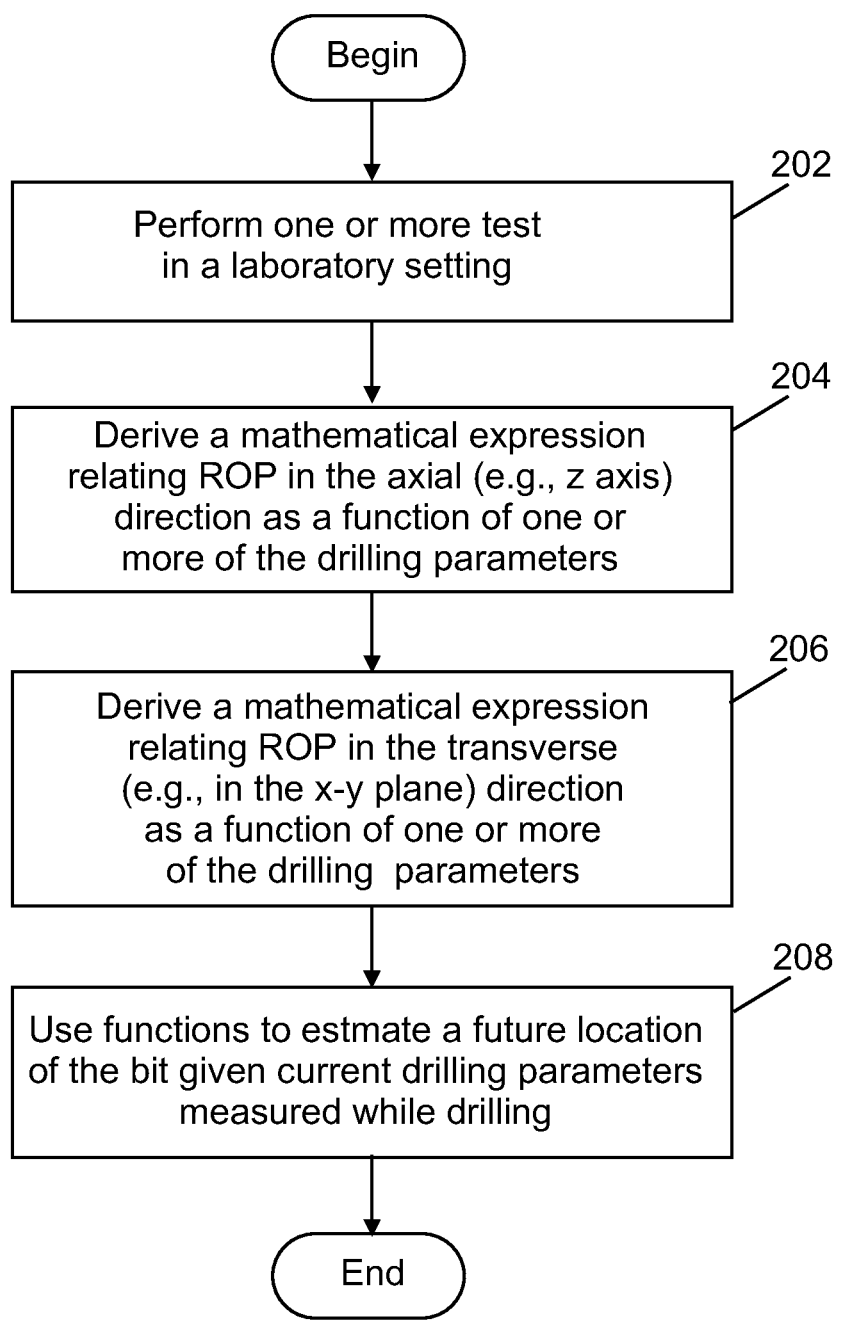

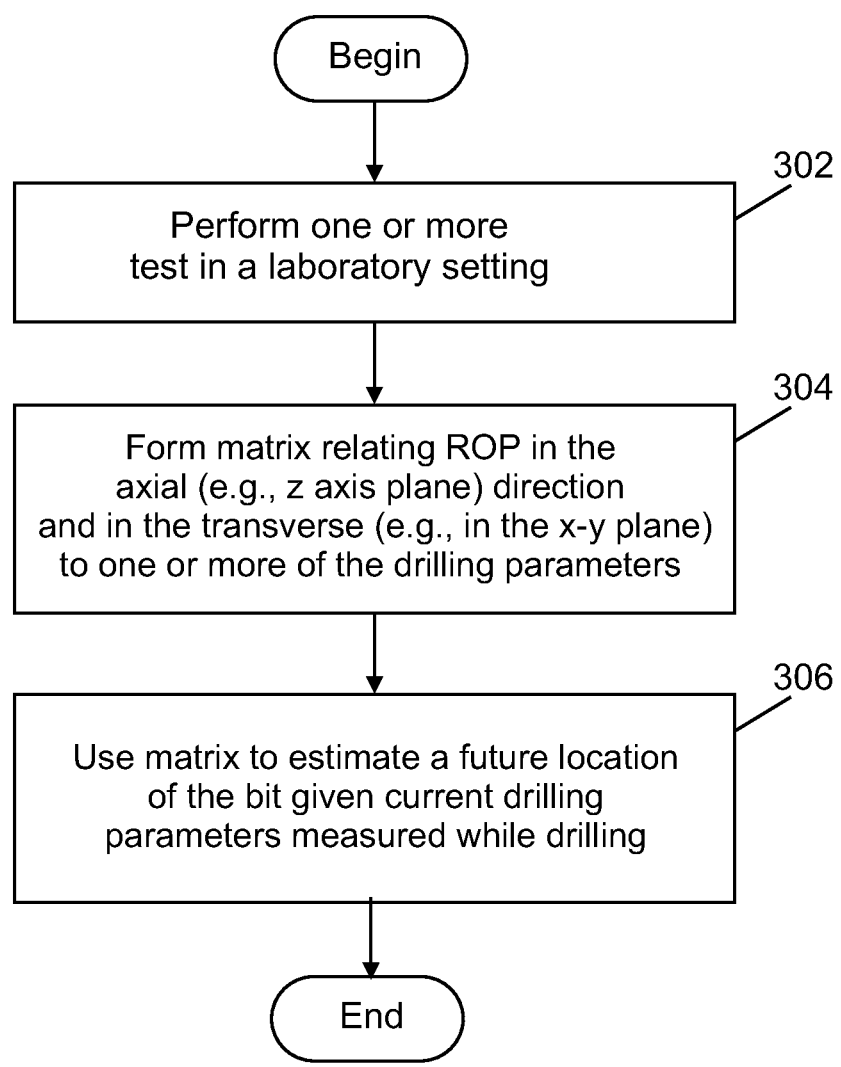

MULTI-PARAMETER BIT RESPONSE MODEL

CROSS-REFERENCE TO RELATED APPLICATIONS AND PRIORITY CLAIM

This application is a Nonprovisional of Provisional Application Ser. No. 61/568,891, entitled "MULTI-PARAMETER BIT RESPONSE MODEL", filed Dec. 9, 2011, under 35 U.S.C. §119(e), which is incorporated herein by reference in its entirety.

BACKGROUND OF THE INVENTION

Various types of drill strings are deployed in a borehole for exploration and production of hydrocarbons and $CO_2$ sequestration. A drill string generally includes drill pipe, a bottom hole assembly (BHA), and a drill bit that is rotated by a drill motor (mud motor) and/or the drill string itself. The BHA contains drill collars, which may be instrumented, and can be used to obtain measurements-while-drilling (MWD) or while-logging (LWD), for example.

Some drill strings can include components that allow the borehole to be drilled in directions other than vertical. Such drilling is referred to in the industry as "directional drilling." While deployed in the borehole, the drill string may be subject to a variety of forces or loads. Because the drill string is in the borehole, the loads are unseen and can affect the dynamic behavior and direction of travel of the drill string.

To measure the loads/forces that affect dynamic behavior and behavior of a drill string, a number of downhole devices are placed in close proximity to the drill bit. Such devices typically include sensors for measuring downhole temperature and pressure, azimuth and inclination measuring devices and sensors that measure the acceleration of the BHA in different directions and the bending moment. The latter data can be used to characterize the drilling dynamics of the BHA, which depends on formation properties, the drill bit and the BHA configuration. In addition, based on measurements made by the MWD or other tools, rate of penetration (ROP), bit revolutions per minute (RPM), average or mean downhole weight on bit (WOB) and average or mean downhole torque on the bit (TOR) can be derived or measured directly. All of the above measurements, and others, fall into the broad category of "drilling parameters."

Additionally, LWD and MWD instruments are frequently attached to the drill string to determine the formation geology and formation fluid conditions during the drilling operations. For instance, these devices can be used for identifying and evaluating rock formations and may be referred to as a "formation parameters" herein. It shall be understood that the formation parameters can be included within the category of drilling parameters.

As drilling parameters change, the immediate result of the unseen loads may be unknown. If the loads are detrimental, then continued operation of the drill string might cause damage or unreliable operation. In addition, the loads can cause either unexpected or undesirable deviations of the drilling trajectory.

One approach to predicting drilling trajectory is to produce models that take into account one or more combinations of drilling parameters. Such models can, in some cases, become so large and require extensive computational power. In some cases, the computation can become so extensive that the models are not practical for use in "real-time" situations.

BRIEF SUMMARY OF THE INVENTION

In one embodiment, a computer-implemented method of generating a directional response of a drill bit based on one or more drilling parameters includes: performing a plurality of tests with a drill bit in a test material having a strength under different experimental drilling parameters; recording the results of the plurality of tests; forming a representation of an expected directional response of the drill bit based on the results; receiving current drilling parameters at a computing device; and generating the directional response based on the current drilling parameters by utilizing the representation.

In another embodiment, a computer implemented method of generating a directional response of a drill bit based on one or more drilling parameters includes: performing a plurality of simulations on a computing device of interactions of a simulated drill bit with a particular test material having a strength under different simulated drilling parameters; recording the results of the plurality of tests; forming a representation of an expected directional response of the drill bit based on the results; receiving current drilling parameters at a computing device; and generating the directional response based on the current drilling parameters by utilizing the representation.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings, wherein like elements are numbered alike, in which:

FIG. 2 is flow chart of a method according to one embodiment; and

FIG. 3 is flow chart of a method according to another embodiment.

DETAILED DESCRIPTION OF THE INVENTION

Figure 1:
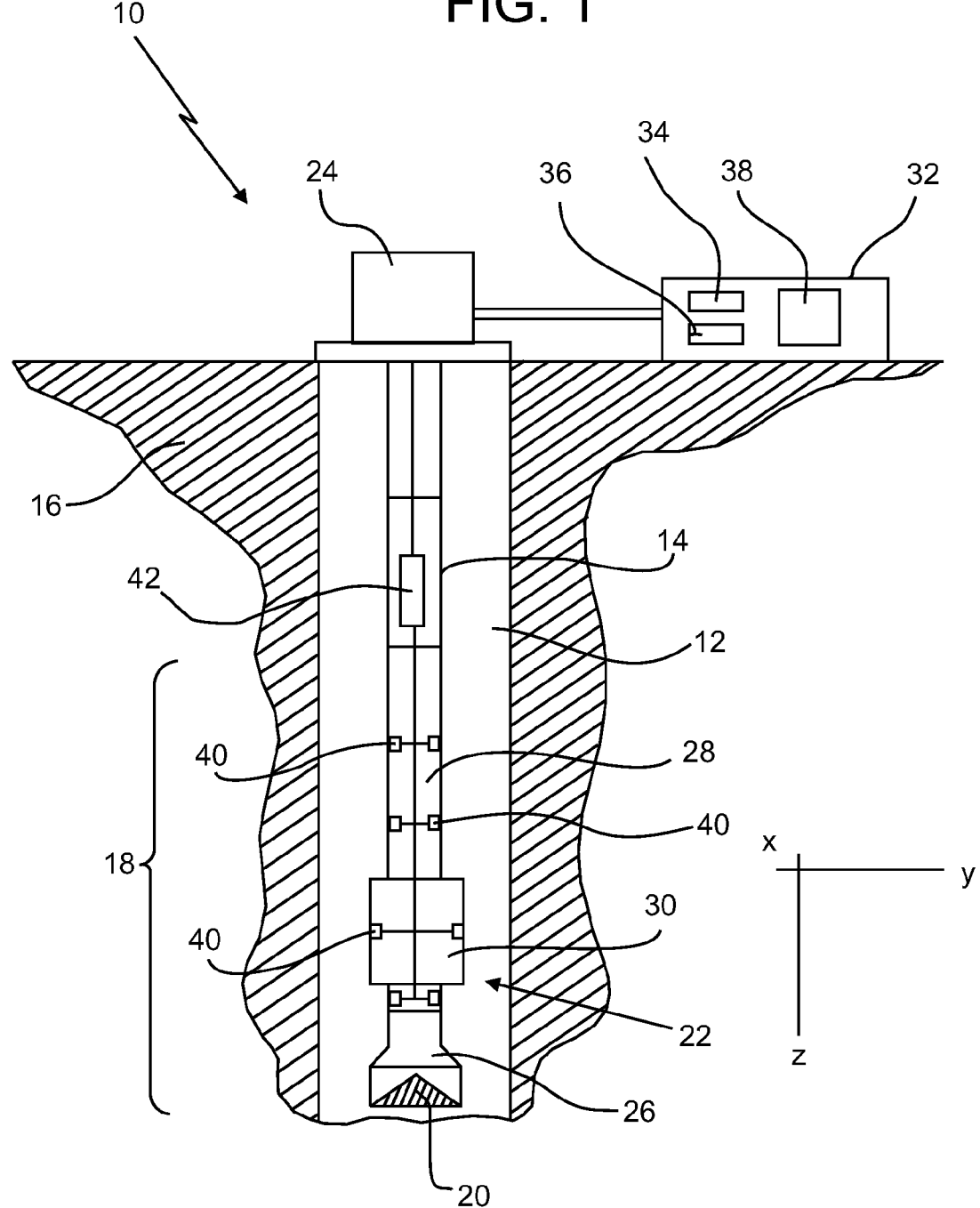
FIG. 1 is an exemplary embodiment of a drilling and/or geosteering system including a drill string disposed in a borehole.

Referring to FIG. 1, an exemplary embodiment of a downhole drilling and/or geosteering system 10 disposed in a borehole 12 is shown. A drill string 14 is disposed in the borehole 12, which penetrates at least one earth formation 16. Although the borehole 12 is shown in FIG. 1 to be of constant diameter, the borehole is not so limited. For example, the borehole 12 may be of varying diameter and/or direction (e.g., azimuth and inclination). The drill string 14 is made from, for example, a pipe or multiple pipe sections.

A drilling assembly 18, which may be configured as a bottomhole assembly (BHA), includes a drill bit 20 that is attached to the bottom end of the drill string 14 via various drilling assembly components. The drilling assembly 18 is configured to be conveyed into the borehole 12 from a drilling rig 22. Exemplary drilling assembly components include a drill bit body 24 operably connected to cutters 26, a drilling motor 28 (e.g., a mud motor), and a stabilizer or reamer 30. In the embodiment shown in FIG. 1, the drill bit 20 is a roller cone bit having three cones, each cone including a cone shell and cutters (e.g., inserts or other cutting elements) that interact with the formation 16 during drilling.

In one embodiment, the drill bit 20 and/or drilling assembly 18 includes one or more sensors 32 and related circuitry for estimating one or more parameters relating to the drilling assembly 18. For example, a distributed sensor system (DSS) may be disposed at the drilling assembly 18 and includes a plurality of sensors 32. The sensors 40 perform measurements associated with static parameters and/or the dynamic motion of the drilling assembly 18 and/or the drill string 14, and may also be configured to measure environmental parameters such as temperature and pressure. Non-limiting example of measurements performed by the sensors include accelerations, velocities, distances, angles, forces, moments, and pressures. In one embodiment, the sensors 40 are coupled to a downhole electronics unit 34, which may receive data from the sensors 40 and transmit the data to a processing system.

A processing unit 36 is shown in FIG. 1 that may be utilized to generate, receive and/or process data relating to models of any of one or more of the drill string 14, the drilling assembly 18 and the drill bit 20. The processing unit 36 may receive input data that is used by or to modify various models of the drilling assembly, including models that simulate performance of the drilling assembly during a drilling and/or steering operation.

In one embodiment, the processing unit 36 is connected in operable communication with the drilling assembly 18 and may be located, for example, at a surface location, a subsea location and/or a surface location on a marine well platform or a marine craft. The processing unit 36 may also be incorporated with the drill string 14 or the drilling assembly 18, or otherwise disposed downhole as desired. The processing unit 36 may be configured to perform functions such as controlling the drilling assembly 18, transmitting and receiving data, processing measurement data, monitoring the drilling assembly 18, and performing simulations of the drilling assembly 18 using mathematical models. The processing unit 36, in one embodiment, includes a processor 38, a data storage device (or a computer-readable medium) 40 for storing, data, models and/or computer programs or software 42. Although the processing unit is described as in communication with downhole components, it may also be configured as a stand-alone unit and provide processing for measurement data and/or simulation data without direct communication with a downhole system. The processing unit may be configured as a single processor or multiple processors, such as a network, cluster or cloud of computers.

Although the drilling assembly of FIG. 1 is shown as including a roller cone bit, it is not so limited. For instance, the drill bit 20 could be a drag bit or any other type of bit. In FIG. 1, the vertical direction is shown by the z axis and the x and y axes define a horizontal plane perpendicular to the z axis. It shall be understood, however, that the axes can be rotated depending on the context. For instance, in one embodiment, the "z axis" can be defined as the direction of travel of the drill bit 20. In such a case, the x-y axes can be rotated to be perpendicular to the z axis or they can remain as illustrated in FIG. 1. As such, from time to time herein, motion along the z axis may be referred to as movement in the axial direction and any other movement can generally be referred to as movement in the lateral direction. For instance, in one case, the bit may travel 1 foot in the axial (z) direction, 3 inches in the y direction and 4 inches in the x direction (or 5 inches in the "lateral" direction).

Drilling assembly models may be generated to represent a drill bit and/or other parts of a drilling assembly, such as drill string 14. The models are utilized to represent the geometry of the drill bit and simulate or predict the drill bit's interaction with the formation during drilling, including the forces exerted on individual components of the drill bit that contact the formation. The model can be used, for example, by a drill ahead model or a build-up rate predictor. In such cases, the prediction of the bit behavior can be used in combination with a BHA model to predict the trajectory of the BHA in two or three dimensions. Thus, the directional response of the drill bit can include effects of the BHA in one embodiment. In some cases, the processing required to utilize such models can be computationally extensive and not feasible in real time.

Embodiments herein can take advantage of previously measured or simulated data for use in predicting bit behavior given a particular set of drilling parameters. In one embodiment, for a given rock type and drilling fluid type, numerical bit/drill string simulations or actual tests (e.g., "lab tests") where various combinations of axial and lateral loading are conducted. The results of the simulations or tests produce outputs that include one or both of a drilling trajectory and drilling velocity as well as possible other values. These results can then be used to generate either a mathematical formula that describes the behavior of the bit/drill string or a look up table that describes the behavior of the bit. The formula or matrix can then be used to estimate one or both of the direction and velocity that the bit will travel given a particular set of drilling parameters (e.g. weight on bit (WOB), side load, pressure, and fluid properties). Such an estimate can be used by, for example, drill ahead models or build-up rate predictors to predict the path or location of the drill bit at a future time.

FIG. 2 is a flow chart illustrating a method according to one embodiment. The method illustrated in FIG. 2 is used to generate functions used to predict one or both of the direction and velocity of travel of the drill bit. For instance, the method shown in FIG. 2 can be used to predict where a particular type of bit may go given particular, drilling parameters (e.g., axial WOB of 5000 lbs. and a lateral WOB (e.g., side load) of 2000 lbs.) in a certain kind of formation (e.g. rock type).

At block 202 one or more tests are performed in a laboratory setting. These tests can include, for example, conducting, for a specific type of bit, tests in a test material (e.g. a specific type or rock or other formation material) that has a specific strength with different drilling parameters (e.g., RPM, WOB, side load, mud type, and/or pressure). The strength of the test material can depend, for example, on one or more of the rock type, the pressure, depth and mud type. These tests can be repeated in different test materials.

The results of the test form a data set. At block 204, a mathematical expression relating ROP in the axial (e.g., z axis) direction as a function of one or more of the drilling parameters is formed from the data set. In some cases, a different expression can be created for each type of test material and/or each drill bit. The expression can be created, for example, by using a fitting technique such as the least squares method. Of course, other techniques known in the art can be used to generate the expression.

At block 206, a mathematical expression relating ROP in the transverse (e.g., in the x-y plane) direction as a function of one or more of the drilling parameters is formed from the data set. As before, a different expression can be created for each type of test material and/or each drill bit and can be created, for example, by using a fitting techniques such as the least squares method. It shall be understood that in some embodiments the order of blocks 204 and 206 can be reversed. It shall also be understood that block 204 could be omitted or formed in a different manner.

At block 208, the expressions (e.g., functions) formed in blocks 204 and 206 are used to estimate a future location of the bit given current drilling parameters measured while drilling. Such an estimate can be used, for example, to adjust current drilling parameters to avoid a drilling hazard or to more close follow a well plane, for example.

FIG. 3 illustrates an alternative method of estimating a future location of a bit given current drilling parameters. At block 302, one or more tests are performed in a laboratory setting. These tests can include, for example, conducting, for a specific type of bit, tests in a specific test material with different experimental drilling parameters (e.g., RPM, WOB, side load, mud type, and/or pressure). These tests can be repeated in different rocks types.

The results of the test form a data set. At block 304, a matrix is formed from the data set that relates relating ROP in the axial (e.g., z axis) direction and in the transverse (x-y) to one or more of the drilling parameters. In some cases, a different matrix can be created for each type of test material and/or each drill bit. It shall be understood that the matrix could also be implemented as one or more look-up tables as will be understood by the skilled artisan.

At block 306, the matrix formed in blocks 304 is used to estimate a future location of the bit given current drilling parameters measured while drilling. Such an estimate can be used, for example, to adjust current drilling parameters to avoid a drilling hazard or to more closely follow a well plan, for example. In one embodiment, if a current drilling parameter is between two values used in the tests, interpolation between the outputs provided by those two values can be used to generate an output for the current drilling parameter.

In the two above methods, actual tests were performed to create the data set. In alternative embodiments, rather than creating the data set from actual tests, a simulation program could be used to generate the data set. The simulation could be any type of simulation program including for example, a program that simulates just the bit or that simulates both the bit and the drill string. In such an embodiment, the simulations are performed with simulated drilling parameters.

In support of the teachings herein, various analysis components may be used, including digital and/or analog systems. The digital and/or analog systems may be included, for example, in the processing unit 36. The systems may include components such as a processor, analog to digital converter, digital to analog converter, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Further, various other components may be included and called upon for providing for aspects of the teachings herein. For example, a power supply (e.g., at least one of a generator, a remote supply and a battery), cooling component, heating component, motive force (such as a translational force, propulsional force, or a rotational force), digital signal processor, analog signal processor, sensor, magnet, antenna, transmitter, receiver, transceiver, controller, optical unit, electrical unit or electromechanical unit may be included in support of the various aspects discussed herein or in support of other functions beyond this disclosure.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The term "or" when used with a list of at least two items is intended to mean any item or combination of items.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A computer-implemented method of generating a directional response of a drill bit based on one or more drilling parameters, the method comprising:
    performing a plurality of tests with a drill bit in a test material having a strength under different experimental drilling parameters;
    recording the results of the plurality of tests;
    forming a representation of an expected directional response of the drill bit based on the results;
    receiving current drilling parameters at a computing device; and
    generating the directional response based on the current drilling parameters by utilizing the representation;
    wherein the representation is a matrix or a look-up table;
    wherein if one of the current drilling parameter is between two of the experimental drilling parameters, directional response is generated based on an interpolation between responses of the two experimental drilling parameters.

2. A computer implemented method of generating a directional response of a drill bit based on one or more drilling parameters, the method comprising:
    performing a plurality of simulations on a computing device of interactions of a simulated drill bit with a particular test material having a strength under different simulated drilling parameters, the simulated drilling parameters including an off-axis side load;
    recording the results of the plurality of tests;
    forming a representation of an expected directional response of the drill bit based on the results;
    receiving current drilling parameters at a computing device; and
    generating the directional response based on the current drilling parameters by utilizing the representation;
    wherein the representation is a matrix or a look-up table;
    wherein if one of the current drilling parameter is between two or more of the experimental drilling parameters, directional response is generated based on an interpolation between responses of the two or more simulated drilling parameters.

* * * * *